United States Patent
Specht et al.

(10) Patent No.: US 7,352,018 B2
(45) Date of Patent: Apr. 1, 2008

(54) NON-VOLATILE MEMORY CELLS AND METHODS FOR FABRICATING NON-VOLATILE MEMORY CELLS

(75) Inventors: Michael Specht, Munich (DE); Franz Hofmann, Munich (DE); Johannes Luyken, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/187,693

(22) Filed: Jul. 22, 2005

(65) Prior Publication Data
US 2007/0018201 A1  Jan. 25, 2007

(51) Int. Cl.
*H01L 27/10* (2006.01)
*H01L 29/73* (2006.01)

(52) U.S. Cl. .............. 257/204; 257/E27.084; 257/66; 257/15; 438/283

(58) Field of Classification Search .......... 257/260, 257/261, 204, E27.084, 262, E21.442, E21.634, 257/E21.635, E21.642, E21.648, E21.654, 257/E21.657, E21.703, E27.063, E2.089, 257/E27.112

See application file for complete search history.

(56) References Cited

U.S. PATENT DOCUMENTS

| | | | | |
|---|---|---|---|---|
| 3,988,604 A | * | 10/1976 | Raymond, Jr. | 708/190 |
| 4,570,328 A | * | 2/1986 | Price et al. | 438/586 |
| 5,287,318 A | * | 2/1994 | Kuki et al. | 365/218 |
| 6,555,670 B1 | | 4/2003 | Kirisawa | |
| 6,580,137 B2 | * | 6/2003 | Parke | 257/401 |
| 6,921,700 B2 | * | 7/2005 | Orlowski et al. | 438/283 |
| 7,098,477 B2 | * | 8/2006 | Zhu et al. | 257/66 |
| 7,227,175 B2 | * | 6/2007 | Yang | 257/15 |
| 2002/0011612 A1 | * | 1/2002 | Hieda | 257/262 |
| 2003/0102518 A1 | * | 6/2003 | Fried et al. | 257/401 |
| 2003/0193058 A1 | * | 10/2003 | Fried et al. | 257/200 |
| 2005/0017240 A1 | * | 1/2005 | Fazan | 257/59 |
| 2005/0104096 A1 | * | 5/2005 | Lee et al. | 257/288 |
| 2005/0218442 A1 | * | 10/2005 | Hieda | 257/306 |
| 2005/0226047 A1 | * | 10/2005 | Hieda et al. | 365/185.14 |
| 2005/0227435 A1 | * | 10/2005 | Oh et al. | 438/257 |
| 2005/0242388 A1 | * | 11/2005 | Willer et al. | 257/314 |
| 2005/0285153 A1 | * | 12/2005 | Weis et al. | 257/232 |

FOREIGN PATENT DOCUMENTS

DE   103 59 889 A1   7/2005

* cited by examiner

*Primary Examiner*—Michelle Estrada
*Assistant Examiner*—Jarrett J Stark
(74) *Attorney, Agent, or Firm*—Slater & Matsil, L.L.P.

(57) ABSTRACT

The invention relates to a method for fabricating stacked non-volatile memory cells. Further, the invention relates to stacked non-volatile memory cells. The invention particularly relates to the field of non-volatile NAND memories having non-volatile stacked memory cells. The stacked non-volatile memory cells are formed on a semiconductor wafer, having a bulk semi-conductive substrate and an SOI semi-conductive layer and are arranged as a bulk FinFET transistor and an SOI FinFet transistor being arranged on top of the bulk FinFET transistor. Both the FinFET transistor and the SOI FinFet transistor are attached to a common charge-trapping layer. A word line with sidewalls is arranged on top of said patterned charge-trapping layer and a spacer oxide layer is arranged on the sidewalls of said word line.

32 Claims, 11 Drawing Sheets

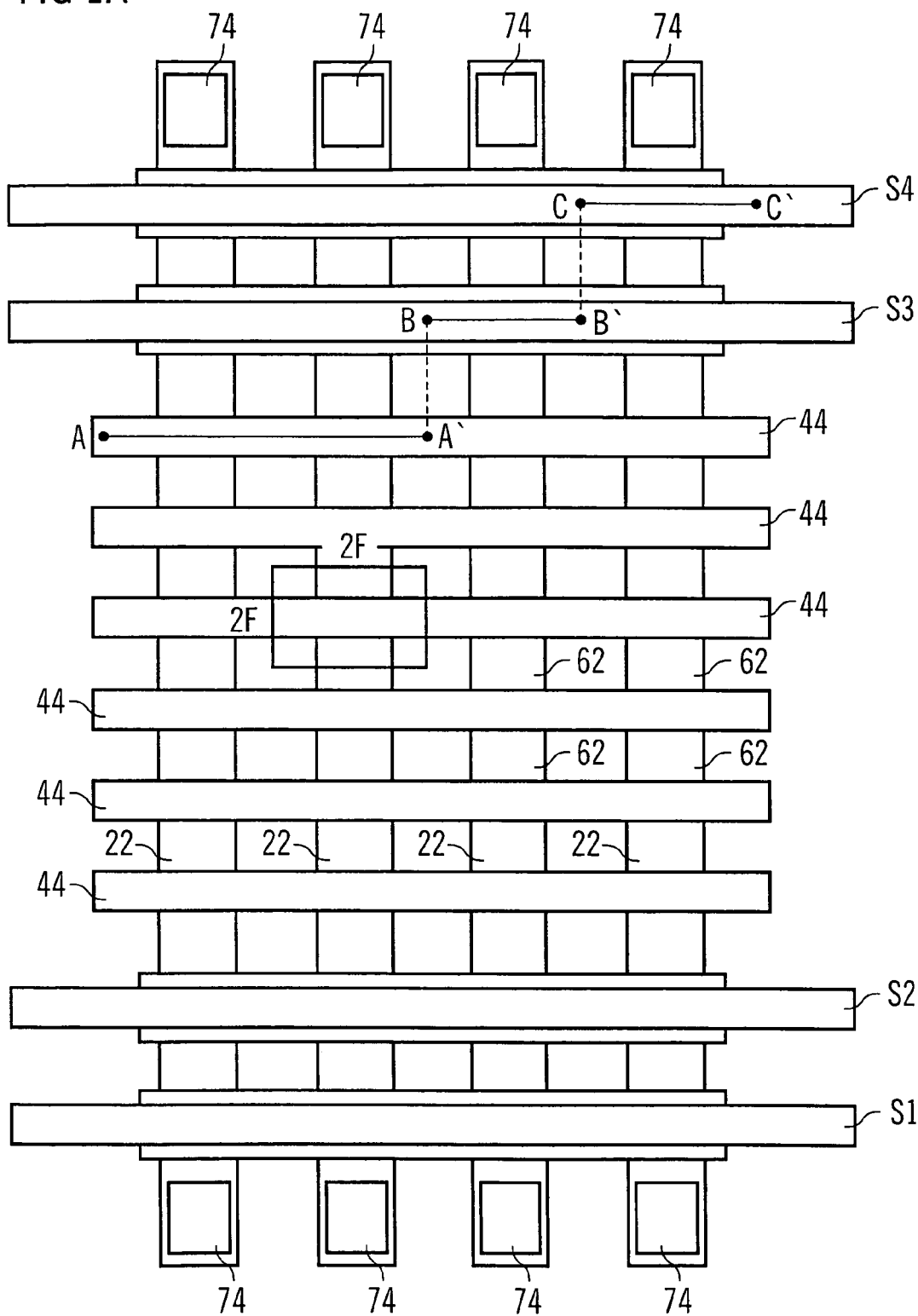

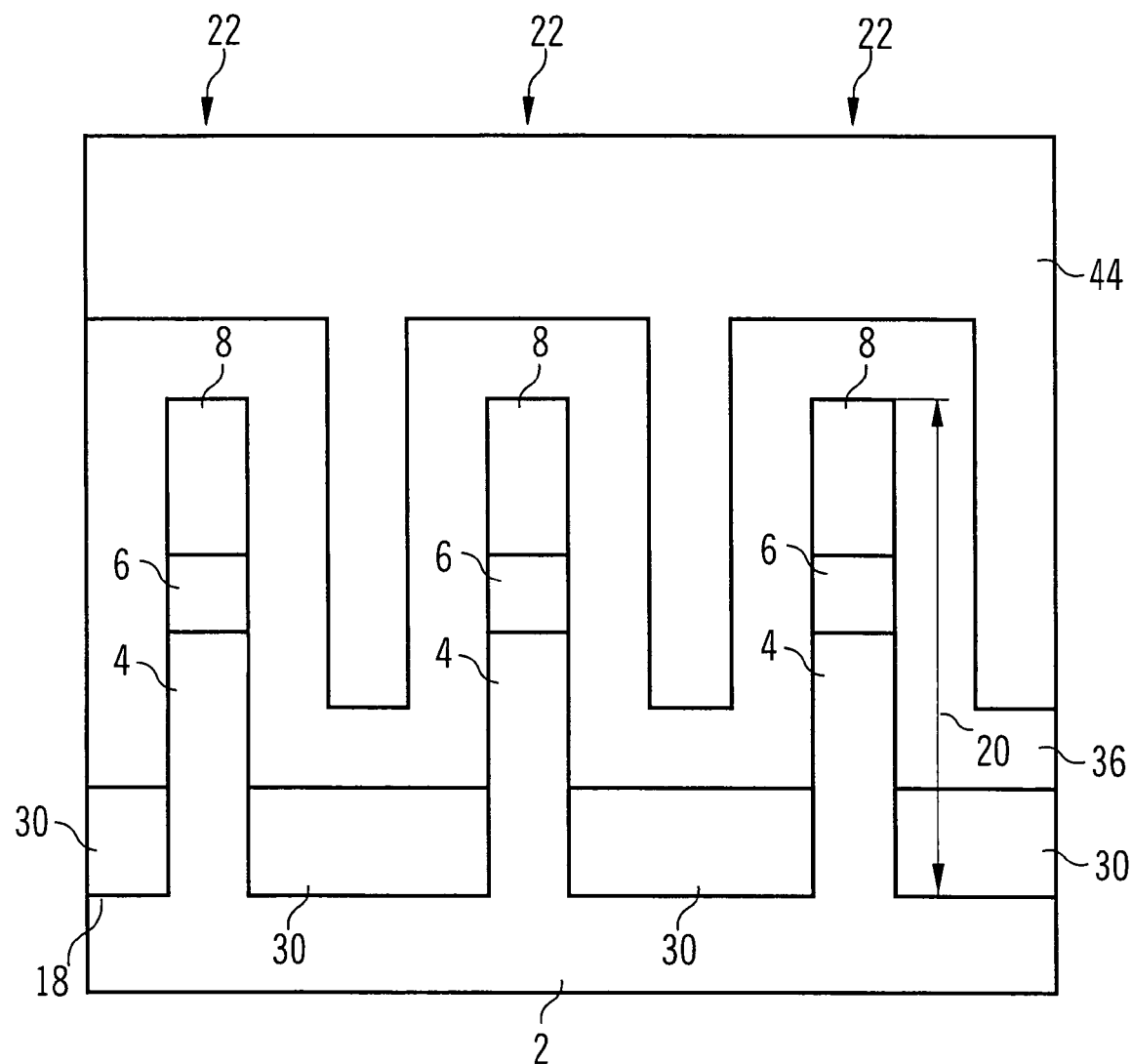

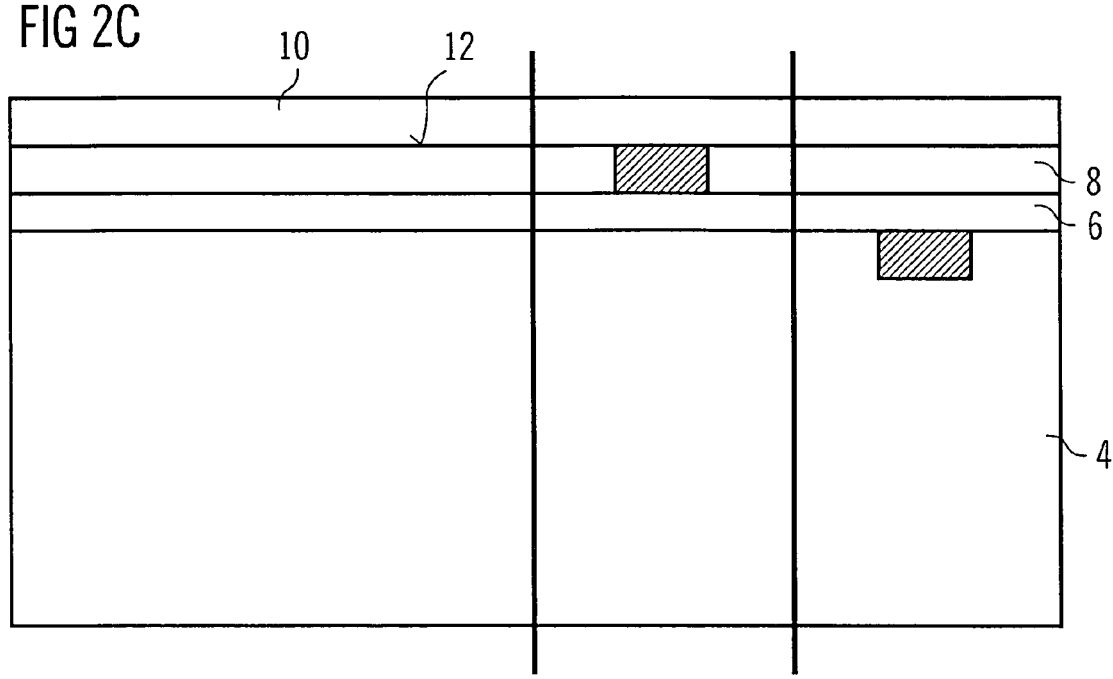
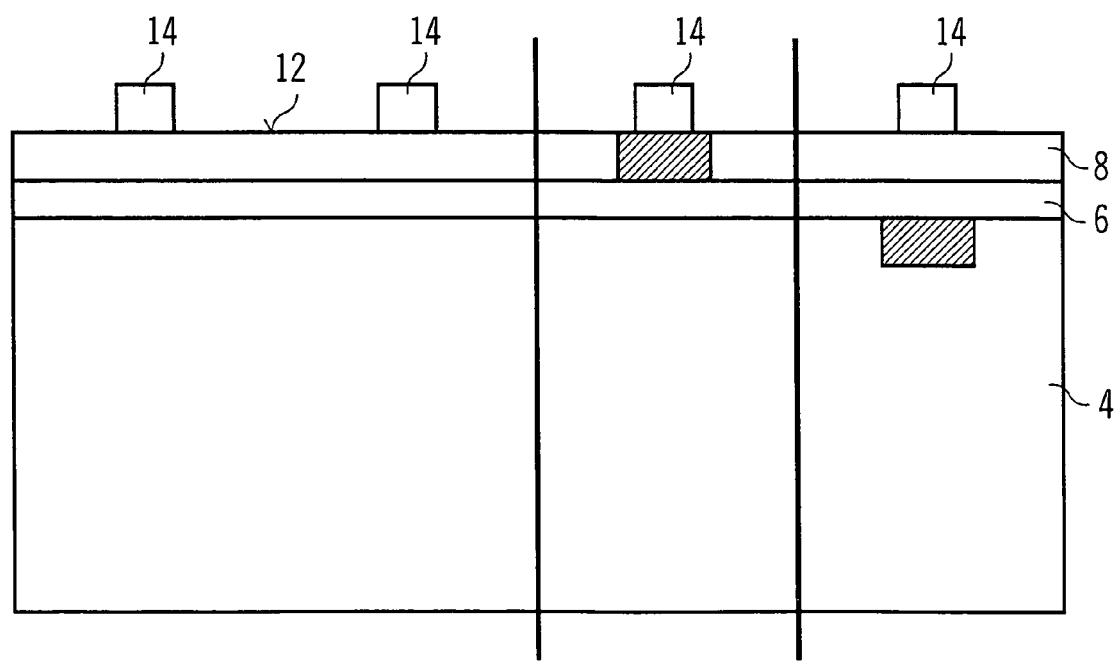

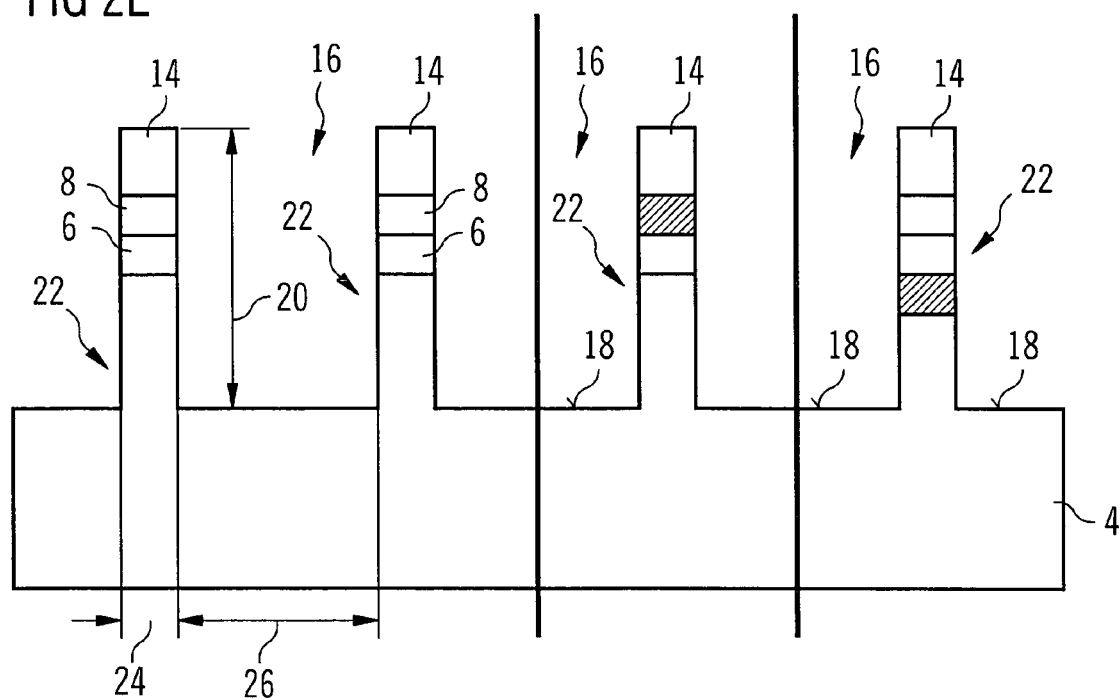
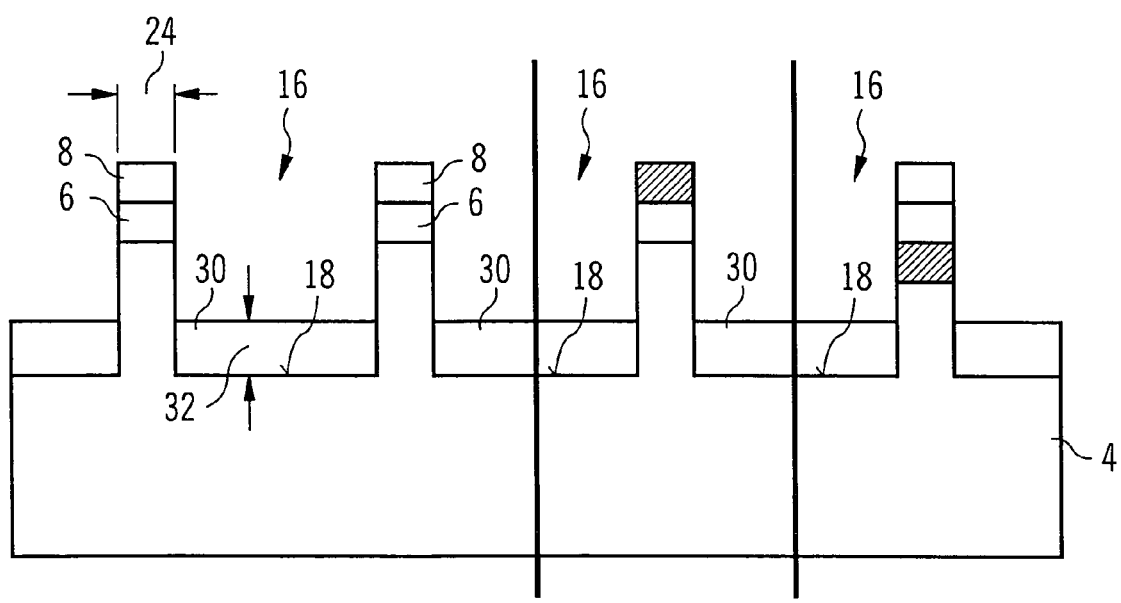

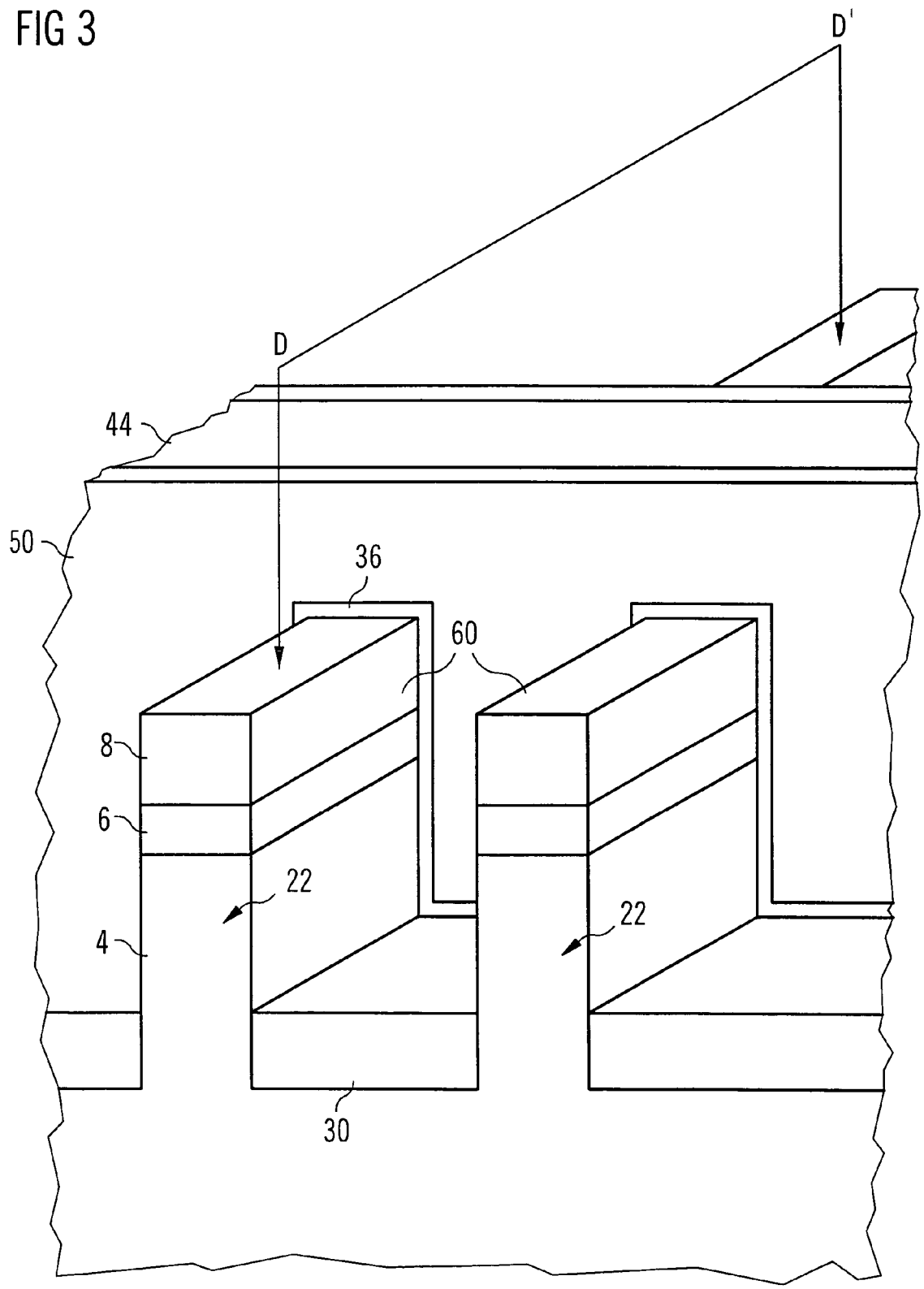

NON-VOLATILE MEMORY CELLS AND METHODS FOR FABRICATING NON-VOLATILE MEMORY CELLS

TECHNICAL FIELD

The invention relates to a method for fabricating stacked non-volatile memory cells. Further, the invention relates to stacked non-volatile memory cells. Embodiments of the invention particularly relate to the field of non-volatile NAND memories having non-volatile stacked memory cells.

BACKGROUND

The manufacturing of integrated circuits aims for continuously decreasing feature sizes of the fabricated components. Decreasing of feature sizes of the fabricated components can be achieved by printing elements using a lithographic patterning process with higher resolution capabilities.

The pattern being projected is provided on a photo mask. The photo mask is illuminated by a light source having a wavelength ranging from ultraviolet (UV) light to deep-UV light in modern applications. The part of the light that is not blocked or attenuated by the photo mask is projected onto the resist film layer on the surface of a semiconductor wafer using a lithographic projection apparatus. The lithographic projection apparatus comprises a projection lens that usually performs a reduction of the pattern contained on the photo mask, e.g., by a factor of four.

In order to manufacture patterns having line widths in the range of 90 nm or smaller, large efforts have to be undertaken to further enhance the resolution capabilities of a lithographic projection apparatus.

The achievable resolution is determined by several factors. In optical lithography the relationship between the maximal resolution depends on the illumination wavelength and the numerical aperture of the lens of the projection system.

While the illumination wavelength and the numerical aperture are fixed for a given generation of a lithographic projection technology, optimizing the illumination process and implementing so called resolution enhancement techniques (RET) reduces the technology characterising coefficient and thus improves the resolution capabilities of the lithographic projection apparatus.

Currently, there are two concepts known in the art that address the problem of increasing the resolution capabilities. First, off-axis illumination in the projection system of the projection apparatus together with sub-resolution sized assist features is used. Second, the concept of alternating phase shift masks is employed so as to enhance the resolution capabilities of the projection apparatus.

These concepts increase the resolution capabilities in semiconductor manufacturing. However, significant efforts and investments are needed to produce memories having the best possible resolution capabilities.

SUMMARY OF THE INVENTION

Embodiments of the invention provide a method for fabricating non-volatile memory cells using less space on a silicon substrate. Further embodiments of the invention achieve non-volatile memory cells using less space on a silicon substrate. In a particular embodiment of the invention a NAND memory is achieved with less area using the non-volatile memory cells.

These and other technical advantages are generally achieved by embodiments of the present invention that provide for a method for fabricating stacked non-volatile memory cells. A semiconductor wafer is provided, which includes a semi-conductive substrate, a semi-conductive layer, and an insulating layer. The insulating layer is arranged between the semi-conductive substrate and the semi-conductive layer. A mask layer is deposited on the surface of the semi-conductive layer. The mask layer is patterned to form structural elements of the mask layer on the surface of the semi-conductive layer. The semiconductor wafer is etched to form recesses between the structural elements of the mask layer, wherein each recess has a bottom surface to a depth that is at least partially within the semi-conductive substrate to define fins comprised of the semi-conductive layer, the insulating layer, and partially the semi-conductive substrate. A dielectric layer is deposited on the bottom surface of the recesses. The structural elements of the mask layer are removed and a charge-trapping layer is conformably deposited on the semiconductor wafer, the charge-trapping layer covering the dielectric layer and the fins above said dielectric layer. A conductive layer is conformably deposited on the charge-trapping layer. The conductive layer is patterned to form at least one word line having sidewalls, the at least one word line arranged in a direction being substantially different to the orientation of the fins. A spacer oxide layer is deposited on the sidewalls of the word line. A released surface of the fins is formed outside the word line and the spacer oxide layer by partially removing the charge-trapping layer. The released surfaces of the fins are then implanted to define source/drain regions.

Other embodiments provide a method for fabricating a non-volatile NAND memory having stacked memory cells. A semiconductor wafer is provided, which includes a semi-conductive substrate, a semi-conductive layer, and an insulating layer, the insulating layer being arranged between the semi-conductive substrate and the semi-conductive layer. The semiconductor wafer is etched to form a plurality of recesses substantially parallel to each other, wherein each recess has a bottom surface to a depth at least partially within the semi-conductive substrate to define fins that include the semi-conductive layer, the insulating layer, and partially the semi-conductive substrate. A dielectric layer is deposited on the bottom surface of the recesses, and a patterned charge-trapping layer is formed covering the dielectric layer and the fins above the dielectric layer and is arranged in a direction substantially different to the orientation of the fins. A plurality of word lines is formed substantially parallel to each other, wherein each word line has sidewalls and is arranged on top of the patterned charge-trapping layer. A spacer oxide layer is deposited on the sidewalls of the plurality of word lines so as to form a released surface of the fins outside the plurality of word lines and the spacer oxide layer. The released surfaces of the plurality of fins is implanted to define source/drain regions. A plurality of contact plugs is provided, the contact plugs employing a respective electrical contact to the semi-conductive layer and the semi-conductive substrate of each of the plurality of fins.

Yet other embodiments provided a stacked non-volatile memory cell. A semiconductor wafer includes a semi-conductive substrate, a semi-conductive layer, and an insulating layer. The insulating layer is arranged between the semi-conductive substrate and the semi-conductive layer. Recesses are included on semiconductor wafer, wherein each recess has a bottom surface to a depth at least partially within the semi-conductive substrate to define fins that include the semi-conductive layer, the insulating layer, and partially the semi-conductive substrate. A dielectric layer covers the bottom surface of the recesses. A patterned charge-trapping layer covers the dielectric layer and the fins above the dielectric layer and is arranged in a direction substantially different to the orientation of the fins. A word line having sidewalls is arranged on top of the patterned charge-trapping layer, and a spacer oxide layer covers the sidewalls of the word line. Source/drain regions are formed on released surfaces of the fins outside the word line and the spacer oxide layer.

In yet another embodiment, a non-volatile NAND memory has stacked memory cells including a semiconductor wafer, which includes a semi-conductive substrate, a semi-conductive layer, and an insulating layer, the insulating layer arranged between the semi-conductive substrate and the semi-conductive layer. A plurality of recesses is provided on the semiconductor wafer, wherein each recess is substantially parallel to each other and has a bottom surface to a depth being at least partially within the semi-conductive substrate to define fins that include the semi-conductive layer, the insulating layer, and partially the semi-conductive substrate. A dielectric layer covers the bottom surface of the recesses. A patterned charge-trapping layer covers the dielectric layer and the fins above the dielectric layer and is arranged in a direction substantially different to the orientation of the fins. A plurality of word lines is substantially parallel to each other, wherein each word line has sidewalls and is arranged on top of the patterned charge-trapping layer. A spacer oxide layer covers the sidewalls of the plurality of word lines so as to form a released surface of the fins outside the plurality of word lines and the spacer oxide layer. A plurality of source/drain regions is formed over released surfaces of the plurality of fins. A plurality of contact plugs is provided, the contact plugs employing a respective electrical contact to the semi-conductive layer and the semi-conductive substrate of each of the plurality of fins.

In yet another embodiment, a stacked non-volatile memory cell includes a semiconductor wafer, having a bulk semi-conductive substrate and an SOI semi-conductive layer. A bulk FinFET transistor and an SOI FinFet transistor, which is arranged on top of the bulk FinFET transistor, are provided and attached to a common charge-trapping layer. A word line having sidewalls is arranged on top of the patterned charge-trapping layer, and a spacer oxide layer covers the sidewalls of the word line.

BRIEF DESCRIPTION OF THE DRAWINGS

The above features of the present invention will be more clearly understood from consideration of the following descriptions in connection with accompanying drawings in which:

FIG. 1A schematically illustrates a plurality of stacked storage cells in a top view according to an embodiment of the invention;

FIG. 1B schematically illustrates a plurality of stacked storage cells in a side view according to an embodiment of the invention;

FIGS. 2A to 2H schematically illustrate a stacked NAND memory cell in a side view when applying the method steps according to an embodiment of the invention;

FIG. 3 schematically illustrates a stacked NAND memory cell according to an embodiment of the invention;

Figure 2A:
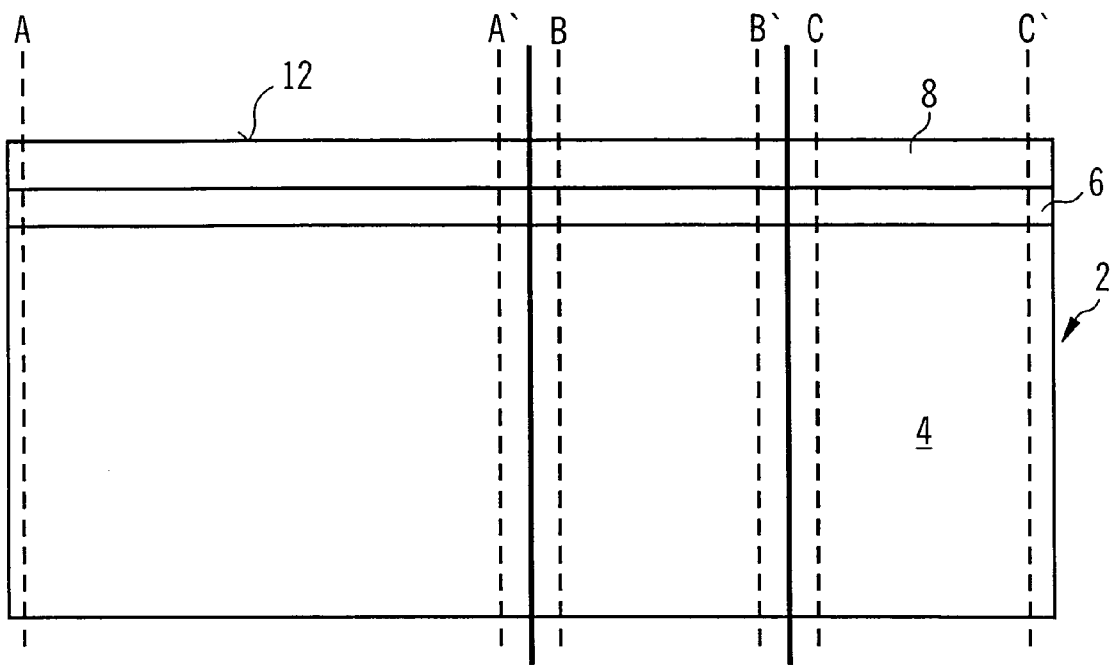

The following list of reference symbols can be used in conjunction with the figures:

| | |
|---|---|
| 2 | semiconductor wafer |
| 4 | semi-conductive substrate |
| 6 | insulating layer |
| 8 | semi-conductive layer |
| 10 | mask layer |
| 12 | surface |
| 14 | structural element |
| 16 | recess |
| 18 | bottom surface |
| 20 | depth |
| 22 | fins |
| 24 | width of fin |
| 26 | width of recess |
| 30 | dielectric layer |
| 32 | thickness of dielectric layer |
| 34 | metal containing layer |
| 36 | charge-trapping layer |
| 37 | thickness of metal containing layer |
| 38 | thickness of charge-trapping layer |
| 40 | conductive layer |
| 44 | word line |
| 46 | sidewalls |
| 50 | spacer oxide layer |
| 60 | released surface |
| 62 | source/drain region |
| 66 | silicided word line |
| 68 | further dielectric layer |
| 70 | contact hole |
| 72 | contact liner |
| 74 | contact plug |
| 82 | first implanting region |
| 84 | second implanting region |
| 86 | first implantation mask |
| 88 | second implantation mask |

DETAILED DESCRIPTION OF ILLUSTRATIVE EMBODIMENTS

A presently preferred embodiment of the method for fabricating stacked non-volatile memory cells and a stacked non-volatile memory cell according to the invention is discussed in detail below. It is appreciated, however, that the present invention provides many applicable inventive concepts that can be embodied in a wide variety of specific contexts. The specific embodiments discussed are merely illustrative of specific ways to apply the method and the memory cell of the invention, and do not limit the scope of the invention.

In the following, embodiments of the method for fabricating stacked non-volatile memory cells and a stacked non-volatile memory cell are described with respect to NAND memories having a plurality of stacked non-volatile memory cells.

With respect to FIG. 1A, a general layout of stacked non-volatile memory cells is shown in a top view. It should be appreciated that FIG. 1A merely serves as an illustration of fabricating stacked non-volatile memory cells, i.e., the individual components shown in FIG. 1A are not true scale.

The stacked non-volatile memory cells are arranged on vertical fins 22. In FIG. 1A, four fins 22 are shown, which are arranged substantially parallel to each other. In a direction perpendicular to the orientation of the fins 22, selection lines or word lines 44 are disposed serving as word lines for selecting a certain memory cell. As shown in FIG. 1A, six selection lines or word lines (in the following referred to as word lines 44) are arranged on top of the four fins 22. A person skilled in the art knows, however, that a non-volatile memory comprises many more memory cells, so as to form a 512 Mb, 1 Gb or even a larger memory.

At the opposing ends of the fins 22, contact plugs 74 are arranged. At least two contact plugs 74 provide an electrical contact to each of the fins 22. The contact plugs 74 and the word lines 44 can be connected to a readout circuit (not shown) thus enabling individual memory cells to be selected and read out by external circuitry.

As this part of the circuit is not part of the invention, it will not be discussed in detail. It should be mentioned that external circuitry is known to a person skilled in the art.

As shown in FIG. 1A, between the left and the right contact plugs 74 of each fin 22, several additional selection lines S1-S4 are arranged. The additional selection lines are needed to select a certain memory cell along the fins 22. The selection lines have associated selection transistors whose function will be explained later.

Referring now to FIG. 1B, a cross section of a memory cell is shown in a side view. The side view is chosen in a direction perpendicular to the semiconductor surface and along a word line 44.

As shown in FIG. 1B, the memory cell, is arranged on a semiconductor wafer 2. The semiconductor wafer 2 is formed by a semi-conductive substrate 4 having an insulating layer 6 and a semi-conductive layer 8 on top. The insulating layer 6 is arranged between the semi-conductive substrate 4 and the semi-conductive layer 8. The semiconductor wafer 2 is provided as an SOI-wafer, for example.

On the semiconductor wafer 2, fins 22 are formed, which range from a top surface of the semi-conductive layer 8 through the insulating layer 6 and partially into the semi-conductive substrate 4, so as to form a bottom surface 18 to a depth 20. Between the fins 22, a dielectric layer 30 is disposed on the bottom surface 18. A patterned charge-trapping layer 36 covers the dielectric layer 30 and the fins 22 above the dielectric layer 30.

The patterned charge-trapping layer 36 is arranged in a direction substantially perpendicular to the orientation of the fins 22. Above the patterned charge-trapping layer 36, the word lines 44 are arranged. The word lines 44 have sidewalls (not shown in FIG. 1B) that are covered by a spacer oxide layer in order to provide an insulation of the word lines 44. On the fins 22, source/drain regions 62 (see FIG. 1A) are formed outside the word line 44 and the spacer oxide layer.

As shown in FIG. 1B, the stacked non-volatile memory cell is formed as a first FinFET (wherein FinFET is an abbreviation for Field Effect Transistor on a FIN) within the semi-conductive substrate 4. The first FinFET is also referred to as a bulk FinFET transistor as it is composed by the "bulk" semi-conductive substrate.

Furthermore, the stacked non-volatile memory cell comprises a second FinFET, which is formed on the semi-conductive layer 8. The second FinFET is called SOI FinFet transistor as it is arranged within the semi-conductive layer 8 being part of an SOI-wafer. The second FinFET is arranged on top of the bulk FinFET transistor and is isolated by insulating layer 6.

The bulk FinFET transistor and the SOI FinFet transistor are attached to the common charge-trapping layer 36, on which the word line 44 is arranged.

The resulting memory cell, therefore, has two transistors, which are connected to the same word line 44. The common charge-trapping layer 36, i.e., an oxide/nitride/oxide-layer stack, provides non-volatile storage properties. As the word line 44 affects both transistors simultaneously, a special read and write sequence is foreseen, which involves the above-described selection transistors.

Before discussing the read and write sequence in detail, a method for forming the memory cell is described in the following. The following method steps also further illustrate possible materials for the individual components and respective geometrical characteristics.

Referring now to FIG. 2A, a method for forming a non-volatile stacked memory cell is illustrated. In FIG. 2A, a semiconductor wafer 2 is shown in a side view. The side view of FIG. 2A (and also the following FIGS. 2B to 2H) are a cross-sectional side view along a plane perpendicular to the surface of semiconductor wafer 2 and along two adjacent memory cells and two neighboring selection lines. The cross-sectional view follows the line A to A', B to B' and C to C', as indicated in FIG. 1A.

The semiconductor wafer 2 has a semi-conductive substrate 4, an insulating layer 6 on top of the semi-conductive substrate 4, and a semi-conductive layer 8 on top of the insulating layer 6. The insulating layer 6 is arranged between the semi-conductive substrate 4 and the semi-conductive layer 8. As an example, the semiconductor wafer 2 is provided as a silicon-on-insulator wafer, which comprises a silicon substrate as semi-conductive substrate 4, a silicon dioxide layer as insulating layer 6, and a silicon layer as semi-conductive layer 8. The insulating layer 6 and the semi-conductive layer 8 should have a respective thickness in the range of between about 50 nm to about 1 µm.

Figure 2B:
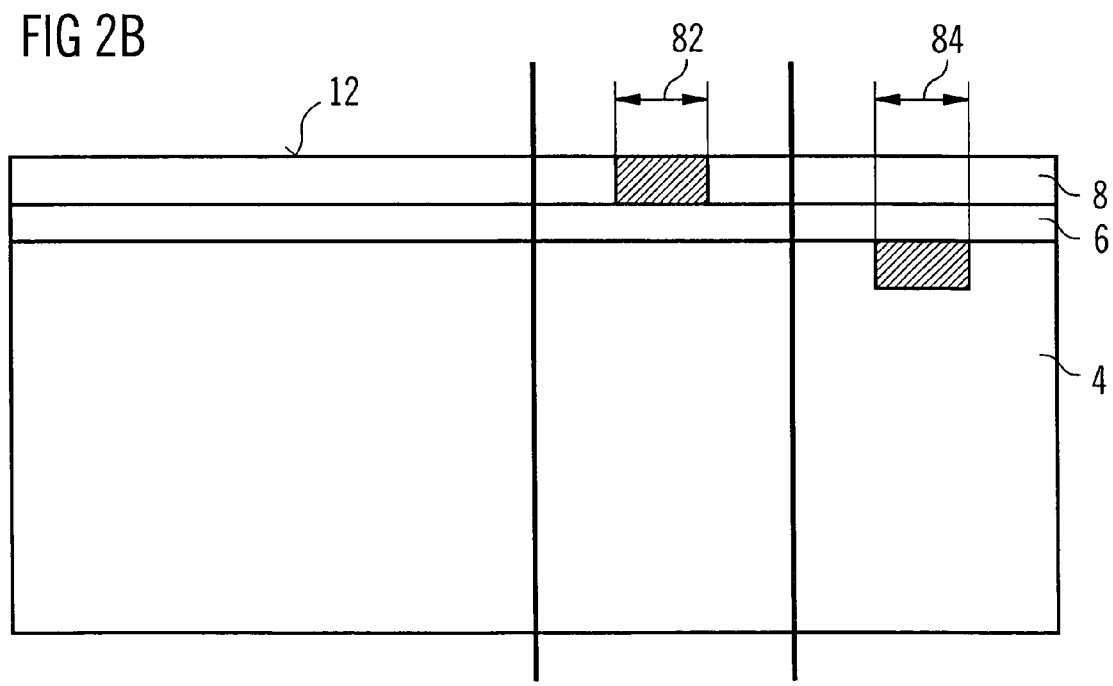

As shown in FIG. 2B, processing continues by sequentially implanting ions at the positions of the selection transistors. The ions are selected such that the threshold voltage of the selection transistors is altered so as to be permanently switched on.

Accordingly, a first implantation mask on the surface 12 of the semi-conductive layer 8 includes first openings defining a first implanting region 82 arranged within the semi-conductive layer 8. Employing an ion implanting with a first energy through the first openings yields to an implanted region within the semi-conductive layer 8.

In a next step, a second implantation mask is formed on the surface 12 of the semi-conductive layer 8. Again, the implantation mask comprises second openings defining a second implanting region 84 arranged within the semi-conductive substrate 4. Both the first implantation mask and the second implantation mask can be formed by a photolithographic patterned mask layer, e.g., a resist layer being exposed in the respective regions and developed so as to form the first and second openings, respectively. Ions having a second energy are implanted through the second openings at least partially into the semi-conductive substrate 4.

Figure 7:
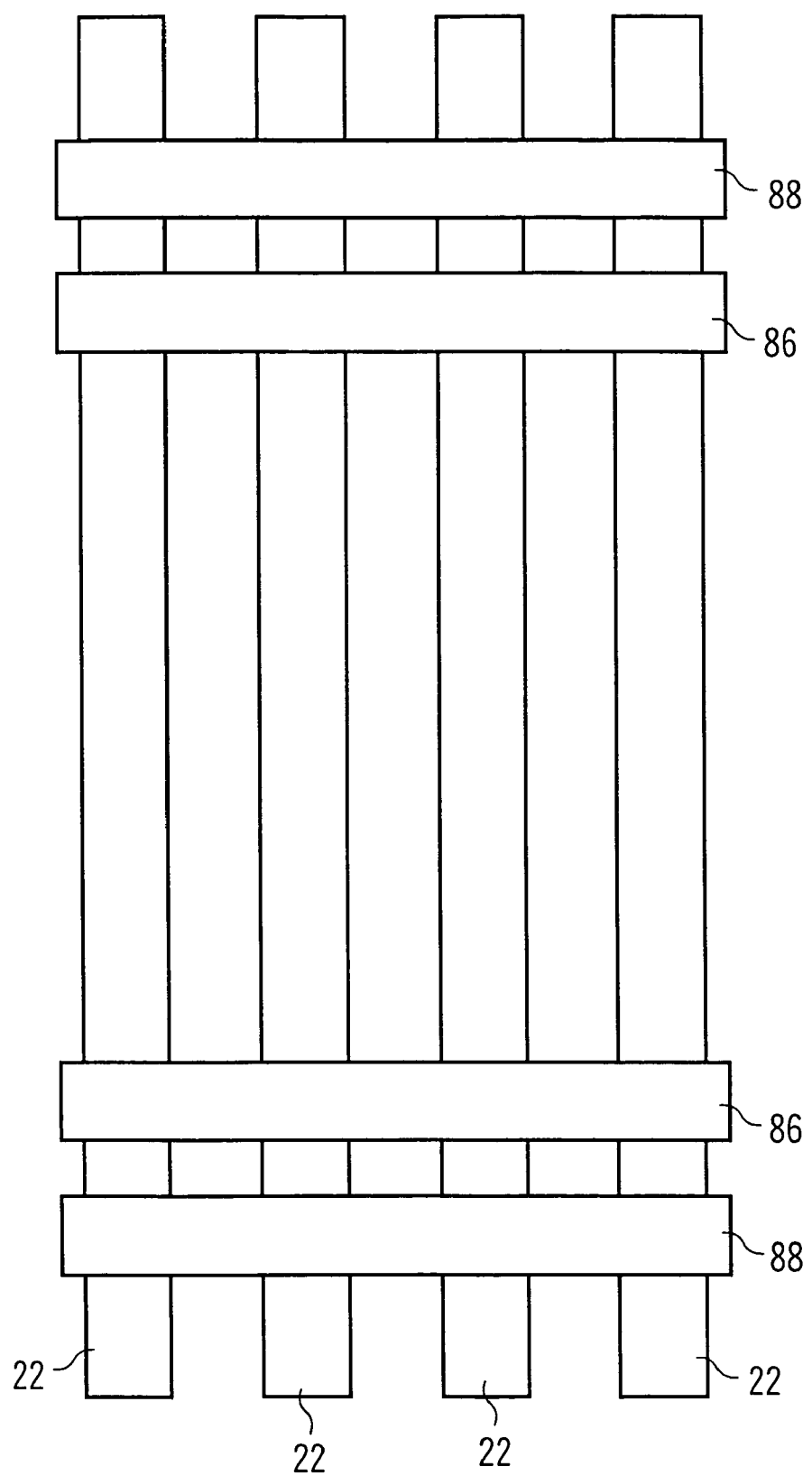
FIG. 7 schematically illustrates an implantation mask of a stacked NAND memory cell according to an embodiment of the invention.

As an example, the first implantation mask and the second implantation mask are shown in FIG. 7 in a top view. FIG. 7 shows the memory cell of FIG. 1A, as indicated by the position of the fins 22. The first implantation mask 86 and the second implantation mask 88 are shown at their respective positions.

In summary, transistors being switched on are formed within the first implanting region 82 and transistors being switched on are formed within the second implanting region 84 by selecting the first energy and the second energy during the step of implanting ions.

In a next step, a mask layer 10 is deposited on the surface 12 of the semi-conductive layer 8, as shown in FIG. 2C. As an example, the step of depositing a mask layer 10 on the surface 12 of the semi-conductive layer 8 can be employed by depositing a nitride layer. In general, mask layer 10 should have a high etching resistance against the materials of the semi-conductive substrate 4, the insulating layer 6 and the semi-conductive layer 8 of the semiconductor wafer 2.

In a next step, the mask layer 10 is lithographically patterned, so as to form structural elements 14 of the mask layer 10 on the surface 12 of the semi-conductive layer 8. Patterning the mask layer 10 comprises depositing a resist layer on the surface of the mask layer 10 and lithographically patterning the resist layer to form a patterned resist layer. After removing the mask layer 10 outside the patterned resist layer by etching, the patterned resist layer can be removed, as shown in FIG. 2D.

Now, the structural elements 14 of the mask layer 10 are used as an etch mask in order to etch the semiconductor wafer 2. This etching step is performed selective to the patterned mask layer 10 by employing an anisotropic etching step, e.g., by reactive ion etching.

As a result recesses 16 are formed in the semiconductor wafer 2 between the structural elements 14 of the mask layer 10, as shown in FIG. 2E. Each of the recesses 16 has a bottom surface 18. Etching is performed of the semiconductor wafer 2 up to a depth 20 at least partially within the semi-conductive substrate 4. Accordingly, fins 22 are defined that include the semi-conductive layer 8, the insulating layer 6, and partially the semi-conductive substrate 4, as shown in FIG. 2E. It should be noted that fins are also etched at the respective positions of the implantation regions 82 and 84.

In summary, etching of the semiconductor wafer 2 creates recesses 16 and corresponding fins 22 formed by the semi-conductive layer 8, the insulating layer 6, and partially the semi-conductive substrate 4. The width 26 of the recesses 16 and the width 24 of the corresponding fins 22 are defined by the lithographic patterning step of mask layer 10. Accordingly, the size of fin 22 is defined by a minimum resolution F of a photolithographic projection apparatus used for lithographic patterning of the mask layer 10.

Referring now to FIG. 2F, in the next processing step, a dielectric layer 30 is deposited on the bottom surface 18 of the recesses 16. Depositing the dielectric layer 30 on the bottom surface 18 of the recesses 16 can be performed in the following way. First, the dielectric layer 30 is conformably deposited as a silicon dioxide layer. The dielectric layer 30 covers the recesses 16 and the structural elements 14 of the mask layer 10.

In a chemical mechanical polishing step, the dielectric layer 30 is removed from the top side of the mask layer 10. Afterwards, the dielectric layer 30 is recessed up to a thickness 32 on the surface 18 of the recessed substrate. The step of recessing the dielectric layer 30 is performed by anisotropic etching, e.g., reactive ion etching.

As shown in FIG. 2F, the structural elements 14 of the mask layer 10 are removed, e.g., by employing a wet etching step. After this process step, the fins 22 are released as freestanding structures having the dielectric layer 30 as an insulation in the lower part of the recess 16.

Figure 2G:
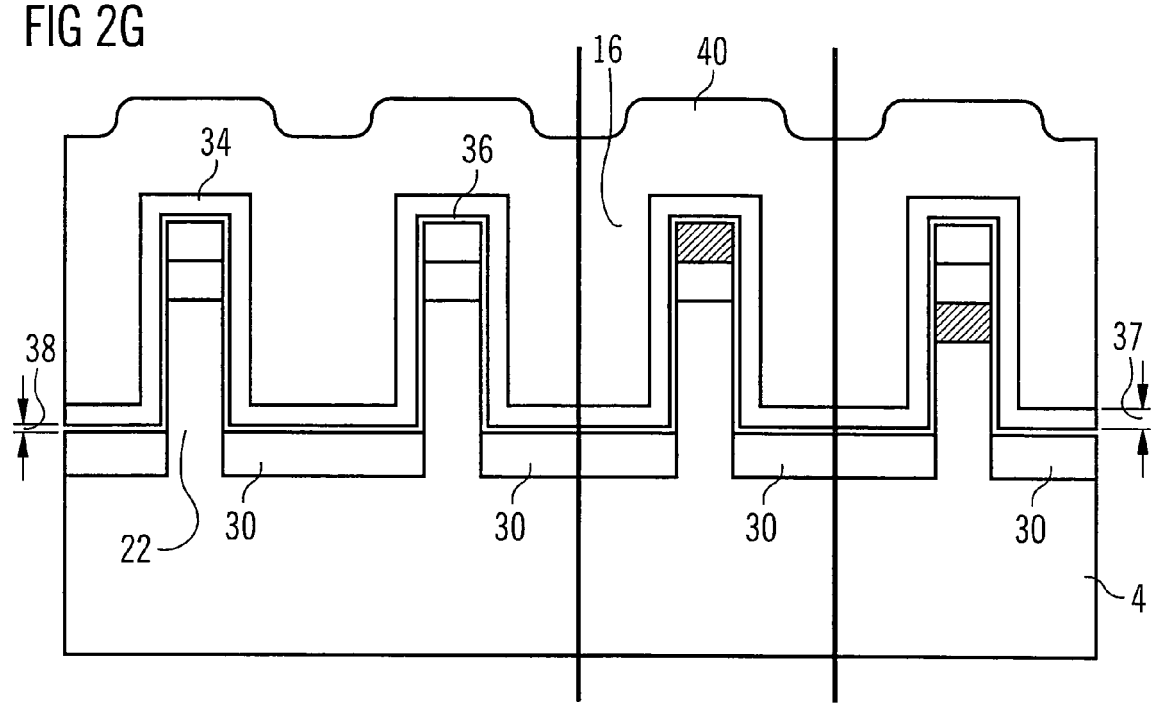

Referring now to FIG. 2G, processing includes further conformably depositing an charge-trapping layer 36 on the semiconductor substrate 4. The charge-trapping layer 36 covers the dielectric layer 30 and the fins 22 above the dielectric layer 30. The step of conformably depositing the charge-trapping layer 36 comprises depositing a oxide/nitride/oxide-layer stack or oxidizing in order to form an oxide layer. As an example, the oxide/nitride/oxide-layer stack has a thickness 38 of less than about 50 nm, preferably in a range of between about 5 nm and about 25 nm.

In order to enhance the conductivity of word lines 44, the step of depositing a charge-trapping layer 36 is followed by conformably depositing a metal containing layer 34 on the surface of the charge-trapping layer 36. The metal containing layer 34 comprises, e.g., titanium or titanium nitride or a titanium-titanium nitride layer stack. The metal containing layer 34 has a thickness 37 of less than about 50 nm, for example in a range of between about 5 nm and about 15 nm.

After depositing the metal containing layer 34, a conductive layer 40 is deposited with a thickness larger than the height of the fins 22, so as to cover the top side of the fins 22 as well. The conductive layer 40 is preferably deposited as a poly-silicon layer and arranged such that the recesses 16 are filled by the conductive layer 40.

Figure 2H:
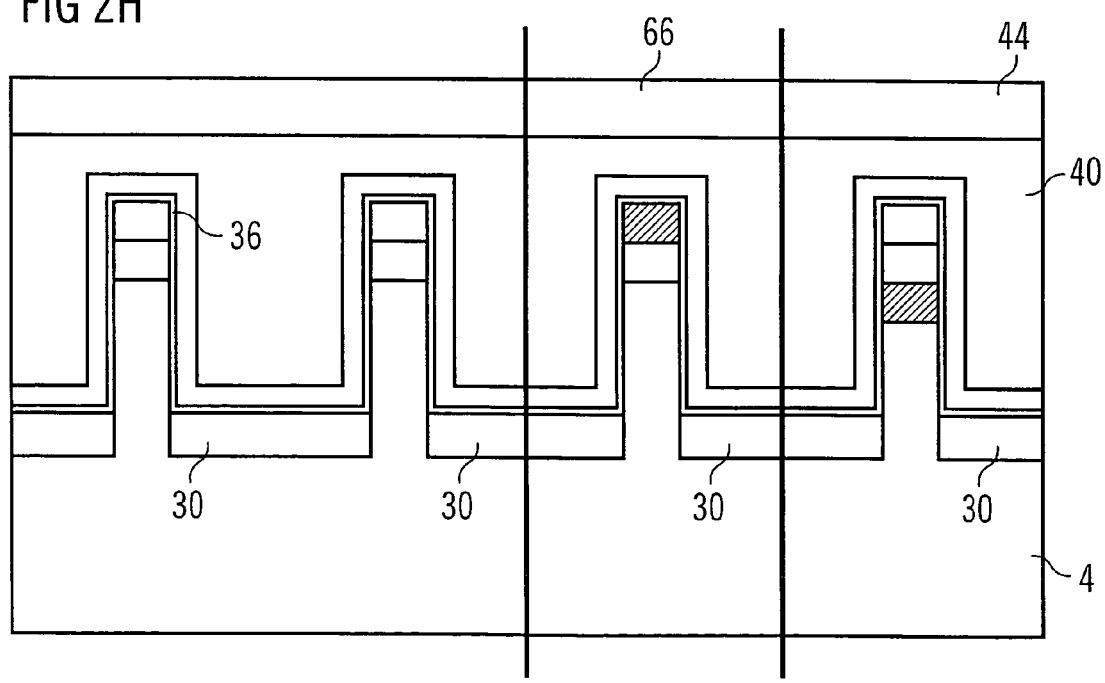

In a next step shown in FIG. 2H, the conductive layer 40 is patterned so as to form the word line 44 for each stacked memory cell, as shown in FIG. 1A. The word line 44 has sidewalls 46 and is arranged in a direction being substantially different to the orientation of the fins 22, preferably perpendicular to the fins 22.

Patterning the conductive layer 40 is usually performed by lithographic structuring, i.e., using a photo resist mask, such as an etch mask, and performing a reactive ion etching step. The width of the resulting word line 44 is defined by a minimum resolution F of a photolithographic projection apparatus, similar to the width of the fins 22. The spaces between adjacent word lines 44 and fins 22 can be defined by the minimum resolution F as well. Accordingly, the memory cell occupies an area on the semiconductor wafer 2 being defined as 2F*2F.

After etching the conductive layer 40 to form the word line 4, the metal containing layer 34 is etched using the word lines 44 as an etch mask. The step of etching the metal containing layer 34 can be performed by reactive ion etching as well.

Next a spacer oxide layer 50 is deposited on the sidewalls 46 of each of the word line 44. Afterwards, a released surface 60 of the fins 22 is formed outside the word line 44 and the spacer oxide layer 50 by partially removing the charge-trapping layer 36, i.e., the part of the charge-trapping layer 36 that is not covered by the word line 44 and the spacer oxide layer 50.

The resulting structure is shown in FIG. 3. FIG. 3 shows two adjacent fins 22 with a common word line 44 in a perspective view. The released surface 60 of the fins 22 comprise the semi-conductive substrate 4, the insulating layer 6 on top of the semi-conductive substrate 4, and the semi-conductive layer 8 on top of the insulating layer 6. The word line 44 with the underlying charge-trapping layer 36 and the spacer oxide layer 50 are visible as well.

Figure 4:
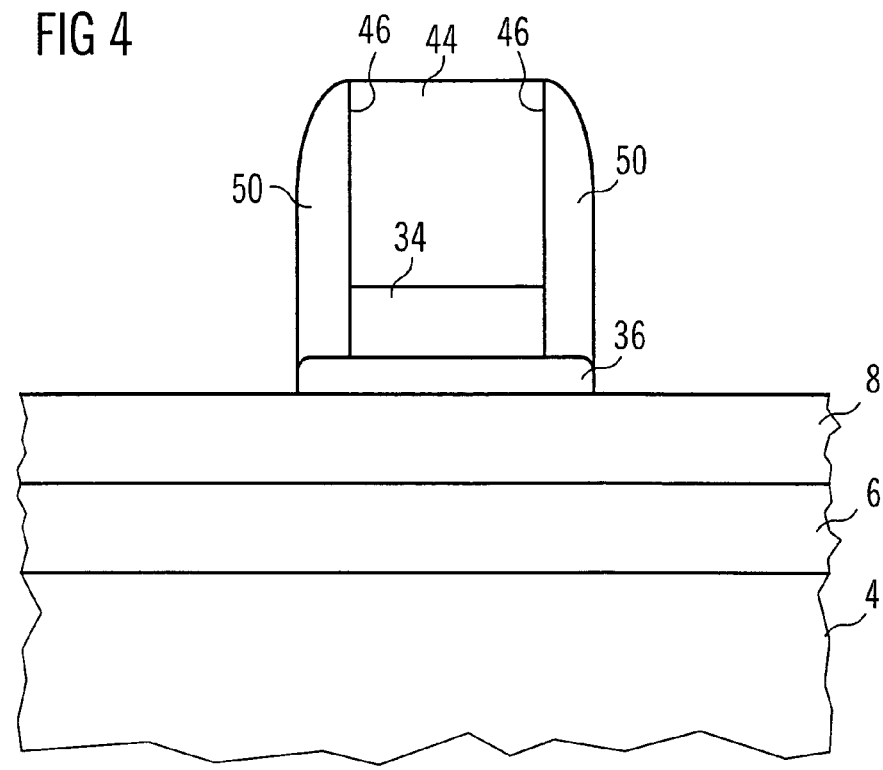
FIG. 4 schematically illustrates a stacked NAND memory cell according to an embodiment of the invention.

The structure shown in FIG. 3 is further explained with reference to FIG. 4. FIG. 4 shows a cross-sectional view of the memory cell according to FIG. 3 along a plane indicated by lines D and D' in FIG. 3. FIG. 4 illustrates a cross-sectional view through fin 22. In addition to FIG. 3, the metal containing layer 34 underneath word line 44 is visible. Furthermore, it is shown that the spacer oxide layer 50 is arranged on top of the charge-trapping layer 36 and is covering the sidewalls 46 of the metal containing layer 34 and the word line 44.

In a next step, source/drain regions 62 for the bulk FinFET and the SOI FinFET are defined by implanting the released surfaces 60 of the fins 22. (The locations of source/drain regions 62 are shown in the plan view of FIG. 1A.) The step of implanting the released surfaces 60 of the fins 22 to define source/drain regions 62 is performed by implanting ions from a plasma phase and employing a thermal drive-in step. The plasma phase doping ensures that the released surfaces 60 are uniformly doped as the plasma can move into the recess 16 between the corresponding fins 22.

After the step of implanting the released surfaces of the fins to define source/drain regions 62 a further dielectric layer 68, e.g. a silicon dioxide layer, is deposited onto the surface of the semiconductor wafer 2 in order to fill the space between the word lines 44. Next, the top side of the word lines 44 is planarized by chemical mechanical polishing.

Figure 5:
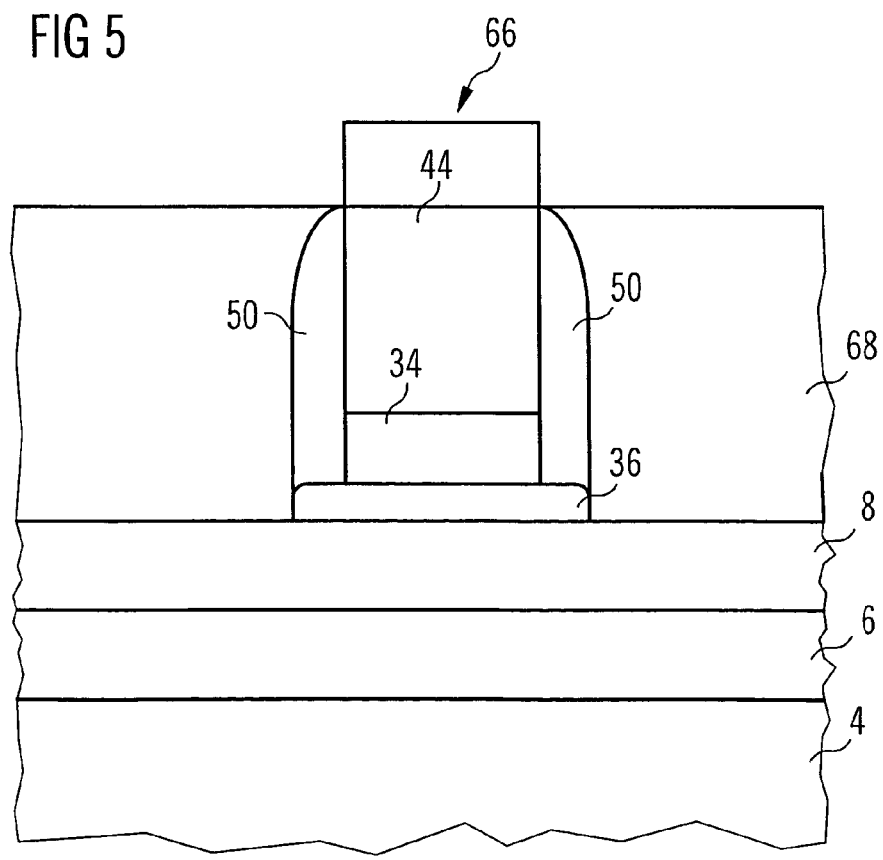
FIG. 5 schematically illustrates a stacked NAND memory cell according to an embodiment of the invention.

Afterwards, the top side of the planar word lines 44 is silicided in order to reduce the resistance of the word lines 44. The silicided word line is shown as reference numeral 66. The resulting structure is shown in FIG. 5, again in a cross-sectional view of the memory cell along a plane indicated by lines D and D' in FIG. 3. A perpendicular cross-sectional view is shown in FIG. 2H.

In further processing steps, interconnecting metal layers are applied, as is known in the art. The processing steps include depositing further dielectric layers 68', etching contact holes and applying the interconnecting wiring.

Figure 6:
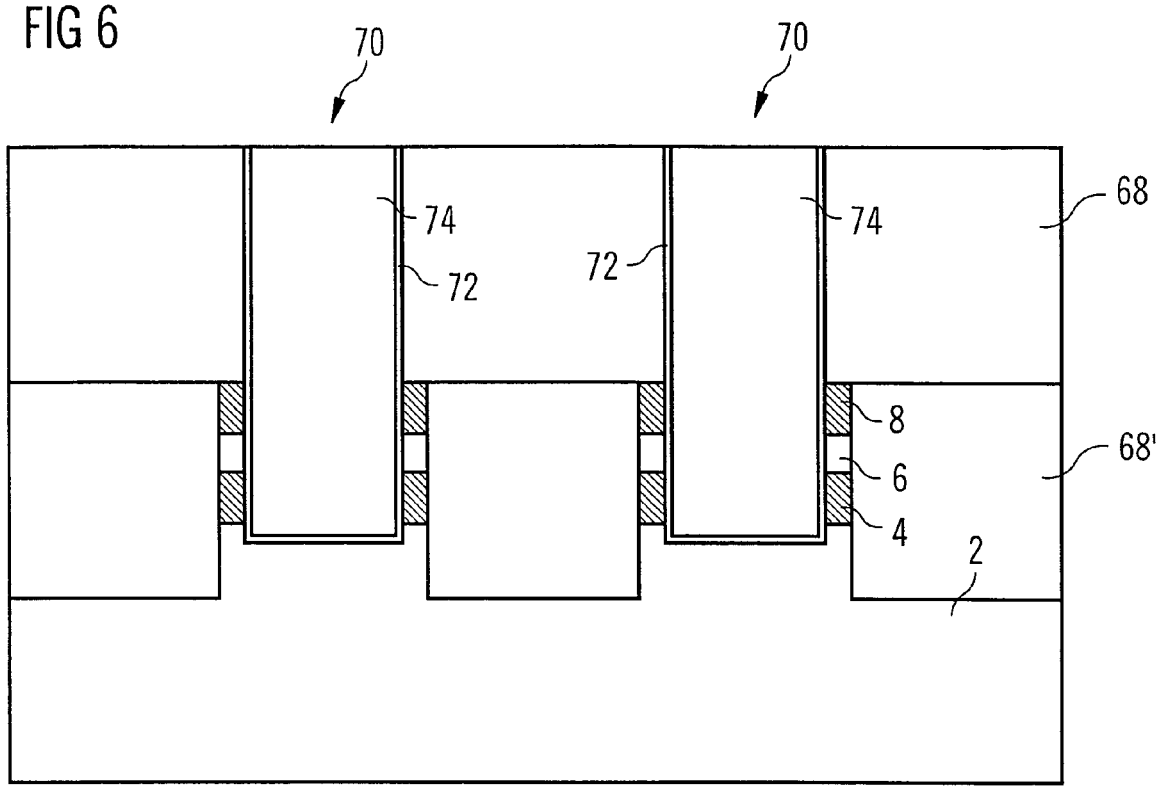
FIG. 6 schematically illustrates a contact to a stacked NAND memory cell according to an embodiment of the invention.

In order to contact the memory cells as discussed above to the interconnecting metal layers, a contact hole 70 is etched reaching from the surface of one or more further dielectric layers 68 and 68' partially into the semi-conductive layer 8 of a respective fin 22, as shown in FIG. 6.

The contact hole 70 is etched through dielectric layers 68 and 68' above each of the fins 22 in the first implantation region 82 and second implantation region 84. The contact hole 70 is filled with a barrier layer 72 on the sidewalls and on the bottom walls of the contact hole. The barrier layer 72 comprises, e.g., titanium and/or titanium-nitride. Afterwards, the contact hole 70 is filled with a contact plug 74, e.g., a tungsten plug. At least two contact plugs are formed at a respective end of the fins 22, so as to be able to contact both ends of bulk FinFETs and the SOI FinFETs along a respective fin.

During the fabrication of the memory cells, the selection transistors are formed similar to the bulk FinFETs and the SOI FinFETs. The selection lines associated with each selection transistor are formed during the step of forming the word lines. For each fin 22, at least two further selection lines are formed next to each contact plug 74. The selection lines are formed next to the two further selection lines.

Accordingly, the selection lines and the further selection lines are formed substantially perpendicular to the fins.

Figure 8:
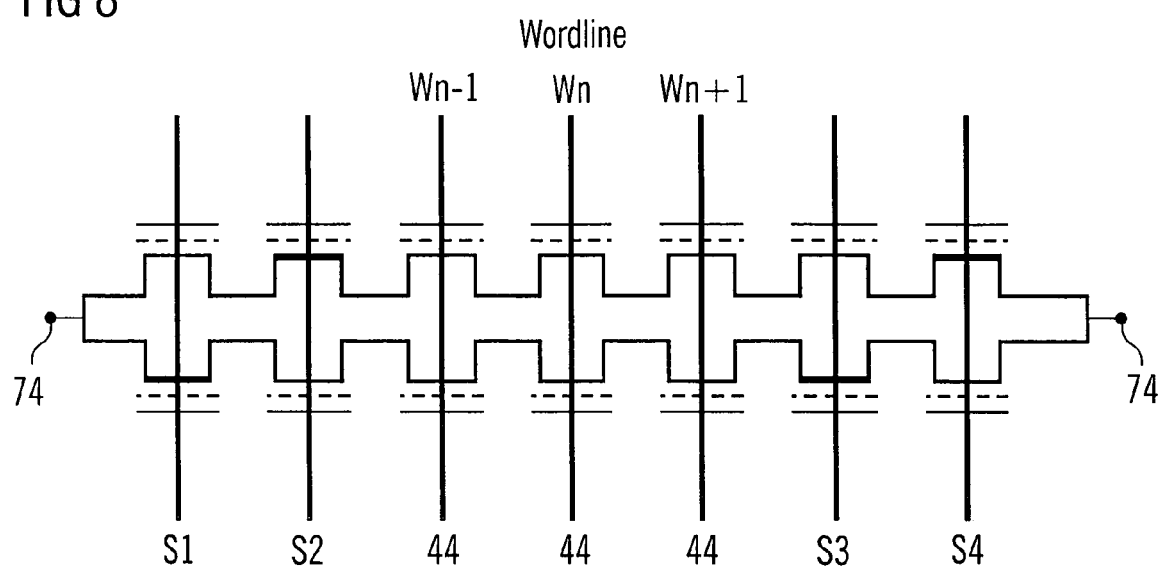
FIG. 8 schematically illustrates a circuit diagram of a stacked NAND memory cell according to an embodiment of the invention.

Referring now to FIG. 8, a diagram of the memory according to FIG. 1A with memory cells according to FIGS. 2 to 6 are schematically shown. For simplicity, only three memory cells are drawn, instead of the six memory cells of FIG. 1A.

Each bulk FinFET is shown in the lower chain of transistors, the SOI FinFETS are shown in the upper chain of transistors. For each memory cell, the bulk FinFETs and the SOI FinFETS are connected by the common word line 44, here denoted Wn−1, Wn, Wn+1.

The selection transistors being configured as always on, are indicated by a bold line in the transistor symbol. The outer selection transistors are connected to contact plug 74. As shown in FIG. 8, the memory cells form a NAND chain. In order to build a non-volatile NAND memory having a memory size of 512 Mb or more, many memory cells are needed. Preferably, the number of memory cells is selected to be 16 or 32 or another multiple of 8 bit.

By applying a certain voltage on the selection lines (here denoted S1 to S4) and on the word lines Wn−1, Wn, Wn+1, each memory cell can be addressed individually during read-out along the chain of bulk FinFETs and SOI FinFETS. Programming and erasing can be performed by selecting proper voltages.

Having described embodiments for a method for fabricating stacked non-volatile memory cells and stacked non-volatile memory cells, it is noted that modifications and variations can be made by persons skilled in the art in light of the above teachings. It is, therefore, to be understood that changes may be made in the particular embodiments of the invention disclosed which are within the scope and spirit of the invention as defined by the appended claims.

Having thus described the invention with the details and the particularity required by the patent laws, what is claimed and desired to be protected by Letters Patent is set forth in the appended claims.

What is claimed is:

1. A memory cell arrangement, comprising:
   a fin structures, comprising:
      a first semi-conductive region in a first direction;
      an insulating layer disposed above the first semi-conductive region in the first direction; and
      a second semi-conductive region disposed above the insulating layer in the first direction, the second semi-conductive region being electrically isolated from the first semi-conductive region;
   a charge storage layer structure disposed above a portion of the fin structure in a second direction, the second direction being different from the first direction, wherein the fin structure further comprises first source/drain regions within the first semi-conductive region adjacent to the charge storage layer structure and second source/drain regions within the second semi-conductive region adjacent to the charge storage layer structure; and
   a control gate disposed above the charge storage layer structure in the second direction.

2. The memory cell arrangement of claim 1, wherein the memory cell arrangement is a NAND memory cell arrangement.

3. The memory cell arrangement of claim 1,
   wherein the fin structure comprises at least one additional first semi-conductive region in the first direction and at least one additional second semi-conductive region in the first direction, and
   wherein the first semi-conductive region and the at least one additional first semi-conductive region are coupled with each other in series, and
   wherein the second semi-conductive region and the at least one additional second semi-conductive region are coupled with each other in series.

4. The memory cell arrangement of claim 3, further comprising:
   at least one additional charge storage layer structure disposed above at least a portion of the at least one additional first semi-conductive region and at least a portion of the at least one additional second semi-conductive region; and at least one additional control gate disposed above the at least one additional charge storage layer structure.

5. The memory cell arrangement of claim 1, further comprising:

at least one additional fin structure being arranged adjacent to the fin structure, the at least one additional fin structure comprising:
 a first semi-conductive region in the first direction;
 an insulating layer disposed above the first semi-conductive region in the first direction; and
 a second semi-conductive region disposed above the insulating layer in the first direction;

an additional charge storage layer structure disposed above the at least one additional fin structure in the second direction; and an additional control gate disposed above the additional charge storage layer structure in the second direction.

6. The memory cell arrangement of claim 1, further comprising first source/drain regions within the first semi-conductive region adjacent to the charge storage layer structure and second source/drain regions within the second channel region adjacent to the charge storage layer structure.

7. The memory cell arrangement of claim 1, wherein the first semi-conductive region comprises a semiconductor material.

8. The memory cell arrangement of claim 7, wherein the semiconductor material comprises silicon.

9. The memory cell arrangement of claim 1, wherein the second semi-conductive region comprises a semiconductor material.

10. The memory cell arrangement of claim 9, wherein the semiconductor material comprises silicon.

11. The memory cell arrangement of claim 1, wherein the charge storage layer structure is located on at least two opposite sidewalls of the fin structure covering at least a portion of the first semi-conductive region and at least a portion of the second semi-conductive region, the at least two opposite sidewalls of the fin structure being oriented in the first direction.

12. The memory cell arrangement of claim 1, wherein the charge storage layer structure is a charge trapping layer structure.

13. The memory cell arrangement of claim 1, wherein the charge storage layer structure comprises an oxide/nitride/oxide layer stack.

14. The memory cell arrangement of claim 13, wherein the oxide/nitride/oxide layer stack has a thickness of less than about 50 nm.

15. The memory cell arrangement of claim 14, wherein the oxide/nitride/oxide layer stack has a thickness between about 5 nm and about 25 nm.

16. The memory cell arrangement of claim 1, wherein the control gate comprises a metal containing layer structure.

17. The memory cell arrangement of claim 16, wherein the metal containing layer structure comprises titanium.

18. The memory cell arrangement of claim 16, wherein the metal containing layer structure comprises titanium nitride.

19. The memory cell arrangement of claim 16, wherein the metal containing layer structure has a thickness of less than about 50 nm.

20. The memory cell arrangement of claim 19, wherein the metal containing layer structure has a thickness between about 5 nm and about 15 nm.

21. The memory cell arrangement of claim 1, wherein the first semi-conductive region forms a plurality of first transistors and the second semi-conductive region forms a plurality of second transistors, and wherein the memory cell arrangement further comprises a selection device individually selecting one transistor of the first transistors and one transistor of the second transistors.

22. The memory cell arrangement of claim 21, wherein the selection device is formed in the fin structure.

23. The memory cell arrangement of claim 21, wherein the selection device comprises at least two transistors.

24. The memory cell arrangement of claim 23, wherein the at least two transistors comprise normally-on transistors.

25. A NAND memory cell arrangement, comprising:

a fin structure comprising:
 a plurality of first semi-conductive regions coupled in series with one another along a length of the fin structure in a first direction;
 an insulating layer disposed above the first semi-conductive regions in the first direction; and
 a plurality of second semi-conductive regions disposed above the insulating layer in the first direction, the second semi-conductive regions being coupled in series with one another, wherein the second semi-conductive regions are electrically isolated from the first semi-conductive regions;

a plurality of charge storage layer structures above the fin structure in a second direction, the second direction being different from the first direction, each charge storage layer structure being disposed above a respective one of the first semi-conductive regions and a respective one of the second semi-conductive regions;

first source/drain regions within the first semi-conductive regions adjacent to the charge storage layer structures;

second source/drain regions within the second semi-conductive regions adjacent to the charge storage layer structures; and a plurality of control gates, each control gate being disposed above a respective one of the charge storage layer structures in the second direction.

26. The NAND memory cell arrangement of claim 25, further comprising:

at least one additional fin structure arranged adjacent to the fin structure, the at least one additional fin structure comprising:
 a plurality of first semi-conductive regions coupled in series with one another in the first direction,
 an insulating layer disposed above the first semi-conductive regions in the first direction, and
 a plurality of second semi-conductive regions disposed above the insulating layer in the first direction, the second semi-conductive regions being coupled in series with one another in the first direction;

an additional charge storage layer structure disposed above the at least one additional fin structure in the second direction; and an additional control gate disposed above the additional charge storage layer structure in the second direction.

27. The NAND memory cell arrangement of claim 25, wherein the fin structure further comprises source/drain regions next to the first semi-conductive regions and the second semi-conductive regions.

28. The NAND memory cell arrangement of claim 25, wherein each charge storage layer structure is located on at least two opposite sidewalls of the fin structure covering at least a portion of the first semi-conductive regions and at least a portion of the second semi-conductive regions, and wherein planes are defined by the at least two opposite sidewalls of the fin structure being oriented in the first direction.

29. The NAND memory cell arrangement of claim 25, wherein each charge storage layer structure is a charge trapping layer structure.

30. The NAND memory cell arrangement of claim 25, wherein each charge storage layer structure comprises an oxide/nitride/oxide layer stack.

31. The NAND memory cell arrangement of claim 25, wherein each first semi-conductive region further comprises a selection device individually selecting one transistor of first transistors formed within each first semi-conductive region and one transistor of second transistors formed within each second semi-conductive region.

32. The NAND memory cell arrangement of claim 31, wherein the selection device is formed in the fin structure.

* * * * *

UNITED STATES PATENT AND TRADEMARK OFFICE
CERTIFICATE OF CORRECTION

| | | |
|---|---|---|
| PATENT NO. | : 7,352,018 B2 | Page 1 of 1 |
| APPLICATION NO. | : 11/187693 | |
| DATED | : April 1, 2008 | |
| INVENTOR(S) | : Specht et al. | |

It is certified that error appears in the above-identified patent and that said Letters Patent is hereby corrected as shown below:

On the Title Page, Section (56) References Cited, U.S. PATENT DOCUMENTS, 4$^{th}$ entry, delete "6,555,670" and insert --6,555,870--.
In Col. 10, line 30, delete "structures" and insert --structure--.

Signed and Sealed this

Twenty-fourth Day of June, 2008

JON W. DUDAS
*Director of the United States Patent and Trademark Office*